(12) United States Patent
Kumano

(10) Patent No.: US 8,980,540 B2
(45) Date of Patent: Mar. 17, 2015

(54) METHOD OF MANUFACTURING SOLID-STATE IMAGE SENSOR

(71) Applicant: Canon Kabushiki Kaisha, Tokyo (JP)

(72) Inventor: Hideomi Kumano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 162 days.

(21) Appl. No.: 13/772,631

(22) Filed: Feb. 21, 2013

(65) Prior Publication Data

US 2013/0224664 A1 Aug. 29, 2013

(30) Foreign Application Priority Data

Feb. 29, 2012 (JP) ................................. 2012-044301

(51) Int. Cl.
 *G03F 7/26* (2006.01)
 *G03F 7/20* (2006.01)
(52) U.S. Cl.
 CPC .................................... *G03F 7/2022* (2013.01)
 USPC .......................................... 430/394; 430/320
(58) Field of Classification Search
 CPC ............................ G03F 7/2022; H01L 21/027
 USPC .......................................... 430/311, 394, 320
 See application file for complete search history.

(56) References Cited

U.S. PATENT DOCUMENTS

| | | |
|---|---|---|
| 5,561,317 A | 10/1996 | Momma et al. |
| 5,731,131 A | 3/1998 | Momma et al. |
| 7,052,986 B2 | 5/2006 | Yamazaki |
| 7,365,002 B2 | 4/2008 | Yamazaki |
| 2013/0032956 A1* | 2/2013 | Kanou ........................... 257/797 |

FOREIGN PATENT DOCUMENTS

| | | |
|---|---|---|
| JP | 5-006849 A | 1/1993 |
| JP | 11-220116 A | 8/1999 |
| JP | 2003-249640 A | 9/2003 |
| JP | 2004-111866 A | 4/2004 |
| JP | 2004-153115 A | 5/2004 |

* cited by examiner

*Primary Examiner* — Kathleen Duda
(74) *Attorney, Agent, or Firm* — Fitzpatrick, Cella, Harper & Scinto

(57) ABSTRACT

A solid-state image sensor is manufactured through a plurality of photolithography processes. The plurality of photolithography processes includes at least one first lithography process including a dividing exposure step of exposing a substrate using a plurality of photomasks, and at least one second lithography process including a non-dividing exposure step of exposing the substrate using one photomask. The at least one first lithography process includes a process for forming a resist pattern to define active regions on the substrate, and a process for forming a resist pattern to define charge accumulation region.

6 Claims, 6 Drawing Sheets

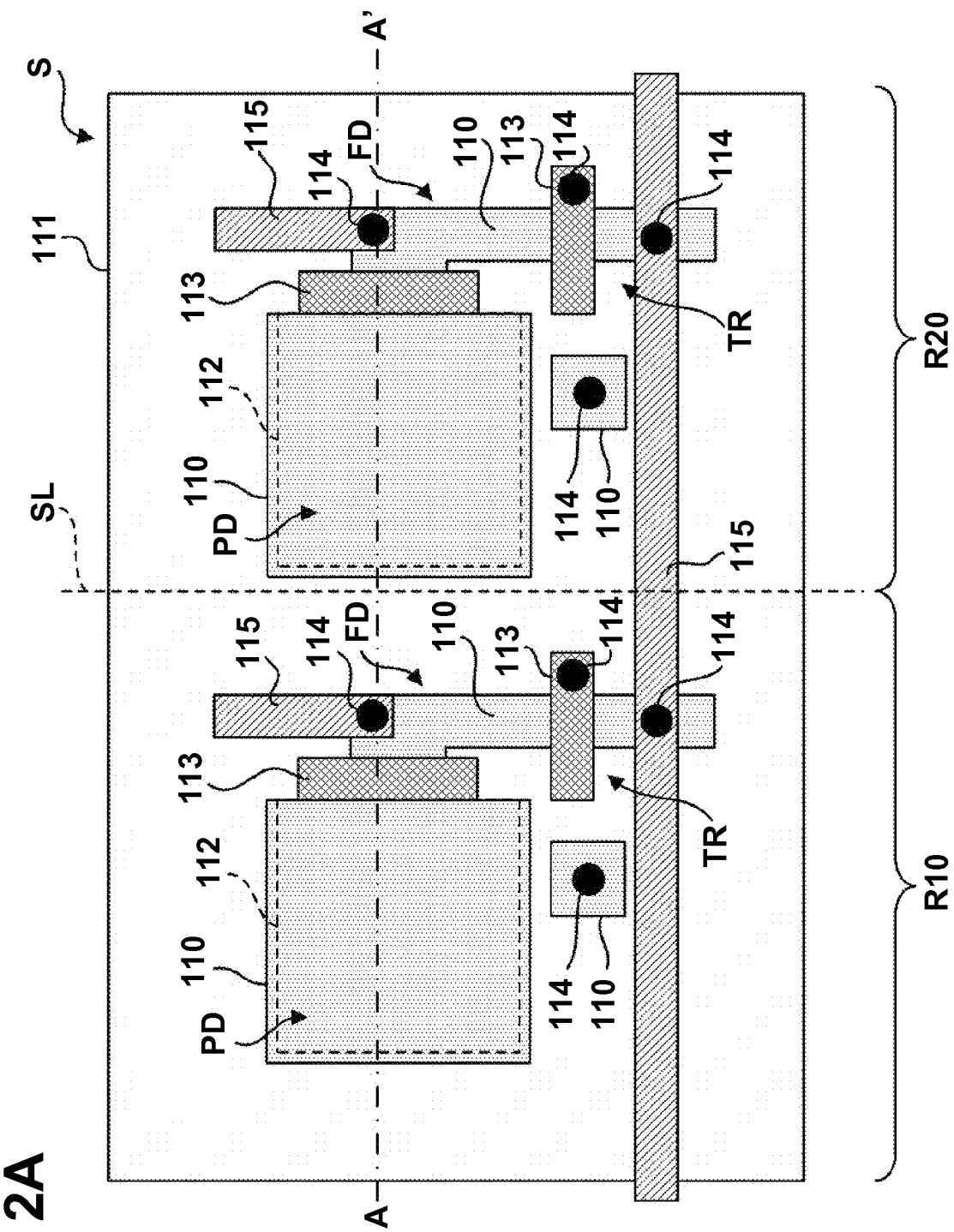

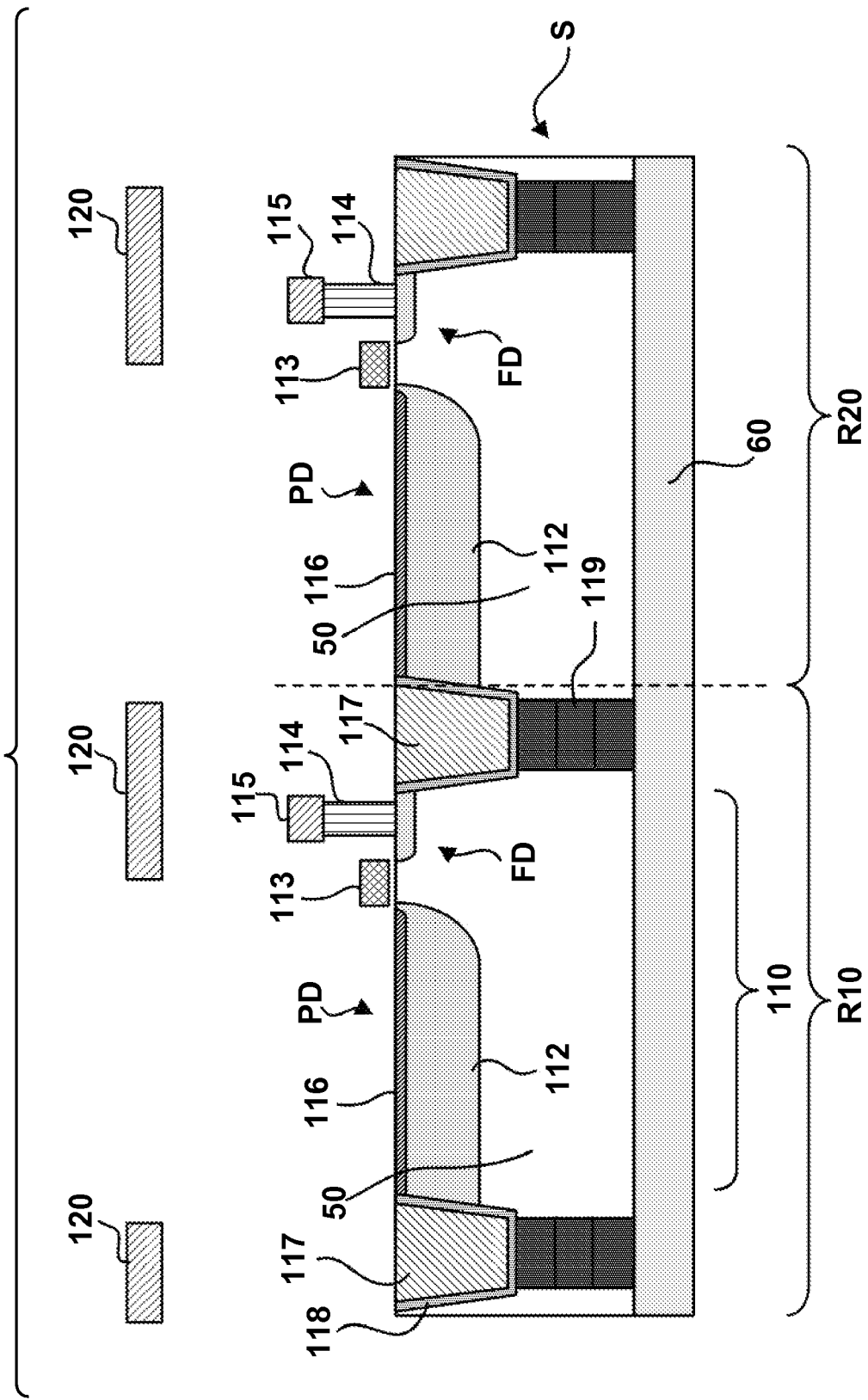

METHOD OF MANUFACTURING SOLID-STATE IMAGE SENSOR

BACKGROUND OF THE INVENTION

1. Field of the Invention

The present invention relates to a method of manufacturing a solid-state image sensor.

2. Description of the Related Art

A method of independently exposing a plurality of divided regions using a plurality of photomasks (reticles) so as to form a pattern of one layer is known. Such method will be referred to as dividing exposure hereinafter. Also a method of exposing one region using one photomask so as to form a pattern of one layer is known. Such method will be referred to as non-dividing exposure hereinafter. Note that the concept of "layer" includes a wiring layer such as a polysilicon wiring layer and metal wiring layer arranged on a semiconductor substrate, and also a layer in a semiconductor substrate, which is configured by a two-dimensional array of impurity regions that can be formed by ion implantation into the substrate.

Japanese Patent Laid-Open No. 5-6849 discloses a method of forming, by dividing exposure, a photoelectric conversion device having a size equal to or larger than a field size of a stepper. Japanese Patent Laid-Open No. 2004-111866 discloses a method of forming, through non-dividing exposure, a layer which substantially influences an operation of a semiconductor device and its underlying layers, and forming, through dividing exposure, layers above the layer which substantially influences the operation of the semiconductor device.

In general, an exposure apparatus which can expose a broad region has a lower resolution and alignment precision than those which can expose a narrow region. When a solid-state image sensor has a large imaging region, if that region is formed by non-dividing exposure, an exposure apparatus having a lower resolution and alignment precision has to be used. However, in this case, the number of pixels may be limited or image quality may be limited depending on the resolution of that exposure apparatus. Hence, a solid-state image sensor has to be manufactured by applying dividing exposure. However, when all layers are to be formed by dividing exposure, cost of photomasks, that of a lithography process, and that of the exposure apparatus increase.

Note that the method disclosed by Japanese Patent Laid-Open No. 2004-111866 is based on the idea that a layer which requires a higher resolution and alignment precision and its underlying layers are to be formed by non-dividing exposure. It is difficult for this method to manufacture a large solid-state image sensor having a higher resolution and image quality.

SUMMARY OF THE INVENTION

The present invention provides a technique advantageous to manufacture a large solid-state image sensor having a higher resolution and image quality.

One of the aspects of the present invention provides a method of manufacturing a solid-state image sensor through a plurality of photolithography processes, wherein the plurality of photolithography processes includes at least one first lithography process including a dividing exposure step of exposing a substrate using a plurality of photomasks, and at least one second lithography process including a non-dividing exposure step of exposing the substrate using one photomask, the at least one first lithography process includes a process for forming a resist pattern to define active regions on the substrate, and a process for forming a resist pattern to define charge accumulation region.

Further features of the present invention will become apparent from the following description of exemplary embodiments with reference to the attached drawings.

BRIEF DESCRIPTION OF THE DRAWINGS

FIGS. 2A and 2B are views showing a partial structure of a pixel array of the solid-state image sensor exemplified in FIG. 1;

DESCRIPTION OF THE EMBODIMENTS

Exemplary embodiments of the present invention will be described hereinafter with reference to the accompanying drawings. In the following exemplary embodiments, a direction of a boundary line extends along a vertical direction in a plan view of a solid-state image sensor and the boundary line is only one. However, the direction of the boundary line can be defined as extending along any direction such as a horizontal direction in the plan view, and the number of the boundary lines can be more than one.

Figure 1:
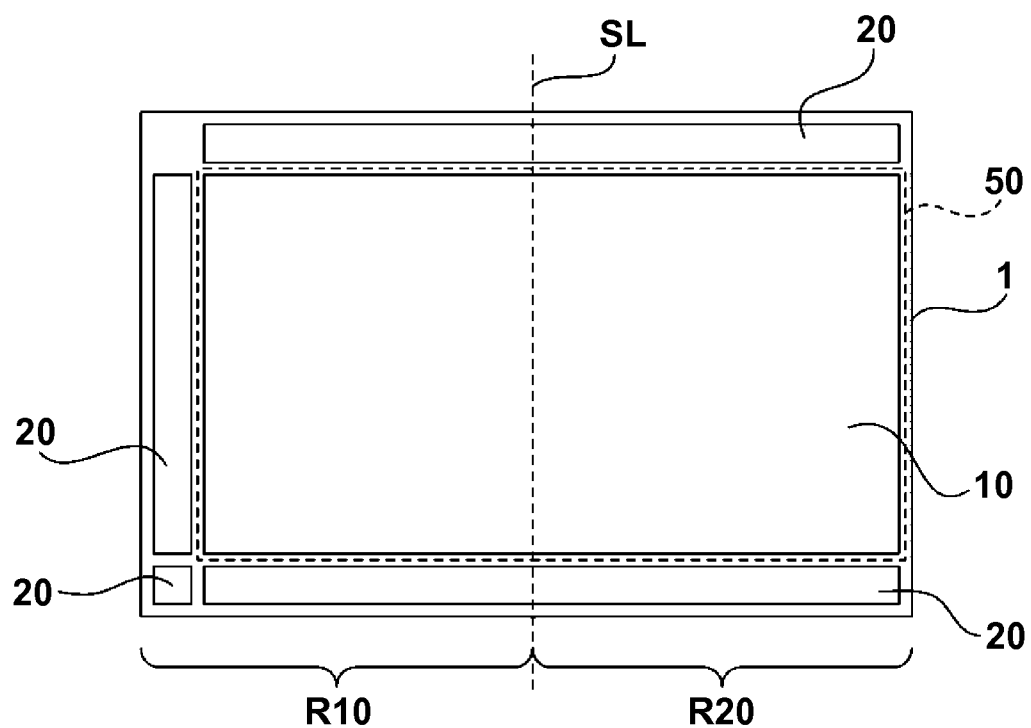
FIG. 1 is a view exemplifying a solid-state image sensor which can be manufactured by a manufacturing method of the present invention.

FIG. 1 exemplifies a solid-state image sensor 1 which can be manufactured by a manufacturing method of the present invention. The solid-state image sensor 1 can be configured as, for example, a MOS image sensor or CCD image sensor. The solid-state image sensor 1 has a pixel array portion 10 in which a plurality of pixels are arranged to form a plurality of rows and a plurality of columns, and peripheral circuit portions 20 which drive and/or control the pixel array portion 10. The peripheral circuit portions 20 can include, for example, a row selecting circuit (for example, row scanning circuit), column selecting circuit (for example, column scanning circuit), signal read-out circuit, control circuit, and the like. Elements (for example, photoelectric conversion portions and transistors) which configure the pixel array portion 10 can be arranged on a common well region 50, and those (for example, transistors) which configure the peripheral circuit portions 20 can be arranged outside the well region 50.

The manufacturing method in the embodiment of the present invention is for manufacturing the solid-state image sensor 1 through a plurality of photolithography processes. The plurality of photolithography processes includes at least one first lithography process and at least one second lithography process. Each first lithography process includes a dividing exposure step of exposing a substrate using a plurality of photomasks. Each second lithography process includes a non-dividing exposure step of exposing a substrate using one photomask. A substrate such as a semiconductor substrate to manufacture the solid-state image sensor 1 typically includes a plurality of chip regions, on each of which one solid-state image sensor 1 is formed, and that substrate then undergoes dicing.

In the dividing exposure step, each chip region is exposed while being divided into a plurality of regions (for example, first and second regions R10 and R20) by a dividing line SL. More specifically, in the dividing exposure step, the first region R10 is exposed using a first photomask, and the second region R20 is exposed using a second photomask. The first region R10 contacts the second region R20 along the dividing line SL. In this case, the first and second photomasks may be formed on different members, or may be formed on different regions of a single member.

FIG. 2A is a plan view illustrating the arrangement, near the dividing line SL, of the pixel array portion 10 of the solid-state image sensor 1 exemplified in FIG. 1. FIG. 2B is a sectional view illustrating the arrangement of a section taken along an A-A' line in FIG. 2A. Note that in FIGS. 2A and 2B, color filters, microlenses, and the like are not illustrated. The pixel array portion 10 of the solid-state image sensor 1 can include active regions 110 and an element isolation region 111. The element isolation region 111 can be, for example, an STI (Shallow Trench Isolation) or LOCOS (Local Oxidation of Silicon) region. The active region 110 can include a photoelectric conversion portion PD and a plurality of transistors TR. In this embodiment, an STI 117 is formed in the element isolation region 111.

The well regions 50 can be formed on a semiconductor region 60. A conductivity type (for example, p type) of each well region 50 can be, for example, the same as that of the semiconductor region 60, and its impurity concentration can be set to be lower than that of the semiconductor region 60. Each photoelectric conversion portion PD can include a charge accumulation region 112 formed in the well region 50, and a conductivity type (for example, n type) of the charge accumulation region 112 is different from that (for example, p type) of the well region 50. Each photoelectric conversion portion PD can include a semiconductor region (surface protection region) 116 arranged on the charge accumulation region 112. A conductivity type (for example, p type) of the semiconductor region 116 is different from that (for example, n type) of the charge accumulation region 112.

One of the plurality of transistors TR can be, for example, a transfer transistor which transfers charges accumulated on the photoelectric conversion portion PD to a floating diffusion FD. In this case, a conductivity type (for example, n type) of the floating diffusion FD is the same as that of the charge accumulation region 112. Another one of the plurality of transistors TR can be an amplifier transistor which outputs a signal according to a potential of the floating diffusion FD onto a vertical signal line (not shown). Still another one of the plurality of transistors TR can be a reset transistor which resets the potential of the floating diffusion FD. A gate electrode of each transistor TR can be configured by, for example, a polysilicon pattern 113. To each active region 110 and polysilicon pattern 113, a plug filled in a contact hole 114 can be connected. To the plug, a metal wiring pattern (first wiring-layer pattern) 115 can be connected. Although not shown in FIGS. 2A and 2B, a second wiring-layer pattern can be arranged on the metal wiring pattern 115 as the first wiring-layer pattern. On the second wiring-layer pattern, a third wring-layer pattern may be arranged. The solid state image sensor 1 can typically have a light-shielding pattern 120.

At least one first lithography process including the dividing exposure step can include, for example, a lithography process for forming a resist pattern to define the active regions 110 on a substrate S. The active regions 110 can be defined by forming the element isolation regions 111 on opening portions (exposed portions of the substrate S) of the resist pattern to define them.

The at least one first lithography process can include a lithography process for forming a resist pattern to define the charge accumulation regions 112 on the substrate S. When the photoelectric conversion portions PD include the charge accumulation regions 112 and semiconductor regions 116, the at least one first lithography process can include a lithography process for forming a resist pattern to define the semiconductor regions 116 on the substrate S.

The at least one first lithography process can further include a lithography process for forming a resist pattern to define potential barrier regions 119 arranged between neighboring charge accumulation regions 112. In this case, a conductivity type (for example, p type) of each potential barrier region 119 is different from that of the charge accumulation region 112. The at least one first lithography process can further include a lithography process for forming a resist pattern to define channel stop regions 118 arranged around a boundary (including a bottom boundary) of the element isolation regions 111. In this case, a conductivity type of each channel stop region 118 is different from that of the charge accumulation region 112.

At least one second lithography process including the non-dividing exposure step can include, for example, a lithography process for forming a resist pattern to define the well region 50 (FIG. 1) on the substrate S. The at least one second lithography process can further include a lithography process for forming a resist pattern to define a light-shielding pattern 120.

The at least one second lithography process may include a lithography process for forming a resist pattern to define the polysilicon patterns 113 including the gate electrodes if it is permitted in terms of design and manufacture. The at least one second lithography process may include a lithography process for forming the metal wiring pattern 115 or another metal wiring pattern (not shown) if it is permitted in terms of design and manufacture.

A method of manufacturing the solid-state image sensor 1 will be exemplarily explained below with reference to FIGS. 1, 2A, 2B, and 3A to 3D. A silicon substrate is prepared as the substrate S, and a first resist pattern to define the well region 50 is formed on the substrate S by the second lithography process including the non-dividing exposure step. Then, the well region 50 is formed by implanting ions into the substrate S using the first resist pattern as an ion implantation mask (see FIGS. 1 and 2B). In this case, after formation of the well region 50, the potential barrier regions 119 can be formed. The resist pattern to define the potential barrier regions 119 is preferably formed by the first lithography process including the dividing exposure step.

Next, a second resist pattern to define the active regions 110 is formed on the substrate S by the first lithography process including the dividing exposure step. The second resist pattern has openings to expose regions where the element isolation regions 111 are to be formed. The substrate S is etched using the second resist pattern as an etching mask to form trenches. Then, ions are implanted into the trenches to form the channel stop regions 118. After that, an insulating film is formed on the trenches to form the element isolation regions 111 having the STI configuration (see FIGS. 2A, 2B, and 3A). Note that a resist pattern different from the second resist pattern may be formed as a mask used to form the channel stop regions 118. In this case, this mask is preferably formed by the first lithography process including the dividing exposure step. In place of such process, the element isolation regions 111 may be formed by the LOCOS method. In this process, the potential barrier regions 119 may be formed.

Next, a third resist pattern to define the charge accumulation regions 112 is formed on the substrate S by the first lithography process including the dividing exposure step. Then, ions are implanted into the substrate S using the third resist pattern as a mask, thereby forming the charge accumulation regions 112 (see FIGS. 2A, 2B, and 3A). Note that in this embodiment, the second resist pattern to define the active regions 110 and the third resist pattern to define the charge accumulation regions 112 are formed by the first lithography process including the dividing exposure step. In this manner, the active regions 110 (or element isolation regions 111) and charge accumulation regions 112 can be precisely aligned, and sensitivity and noise (for example, dark current noise) can be uniformed over a plurality of pixels included in the pixel array portion 10. When alignment errors between the active regions 110 (or element isolation regions 111) and charge accumulation regions 112 become large, the p-n junction capacitances between the charge accumulation regions 112 and regions which contact the regions 112 may lower, resulting in low sensitivity. When alignment errors between the active regions 110 (or element isolation regions 111) and charge accumulation regions 112 become large, the charge accumulation regions 112 and element isolation regions 111 may contact. In this case, dark current noise may increase, and inter-region variations of dark current noise may increase.

Next, a polysilicon film is formed on the substrate S. Then, a fourth resist pattern to define the polysilicon patterns 113 including the gate electrodes is formed by the first lithography process including the dividing exposure step or the second lithography process including the non-dividing exposure step. The polysilicon film is etched using the fourth resist pattern as an etching mask, thereby forming the polysilicon patterns 113 (see FIGS. 2A, 2B, and 3B). Note that when the semiconductor regions 116 are to be formed, a fifth resist pattern to form the regions 116 is formed, and ions are implanted into the substrate S using the fifth resist pattern as an ion implantation mask, thus forming the semiconductor regions 116. The fifth resist pattern is preferably formed by the first lithography process including the dividing exposure step, but it may be formed by the second lithography process including the non-dividing exposure step.

Figure 3A:
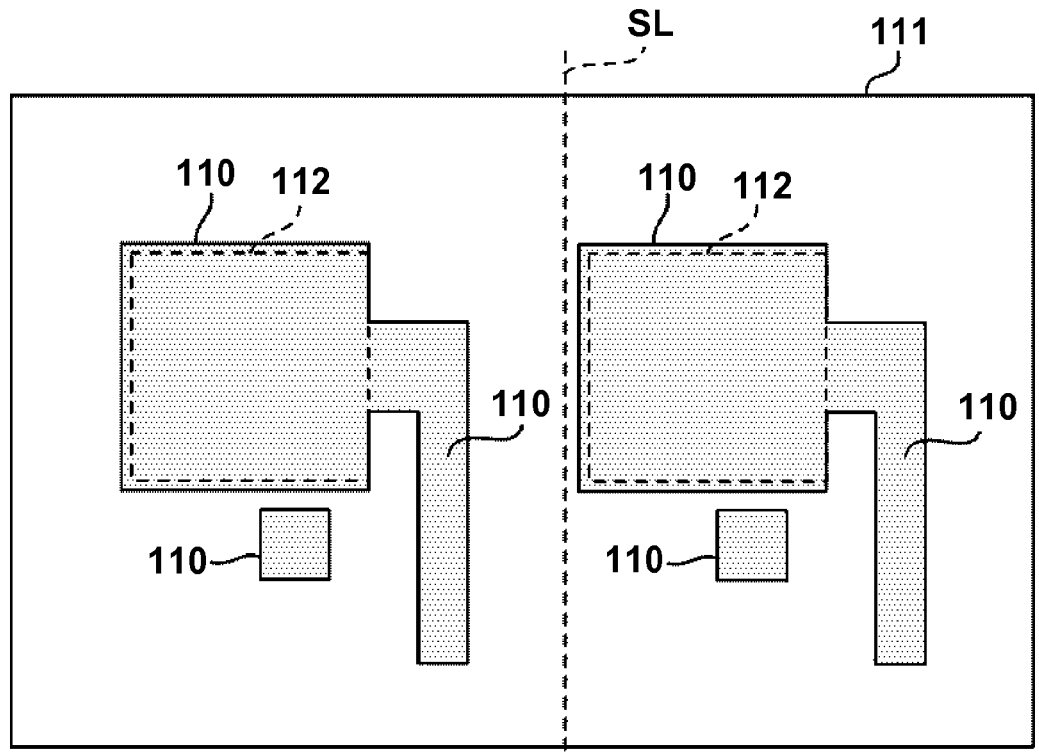
FIGS. 3A to 3D are views exemplarily showing a method of manufacturing a solid-state image sensor.
Figure 3B:
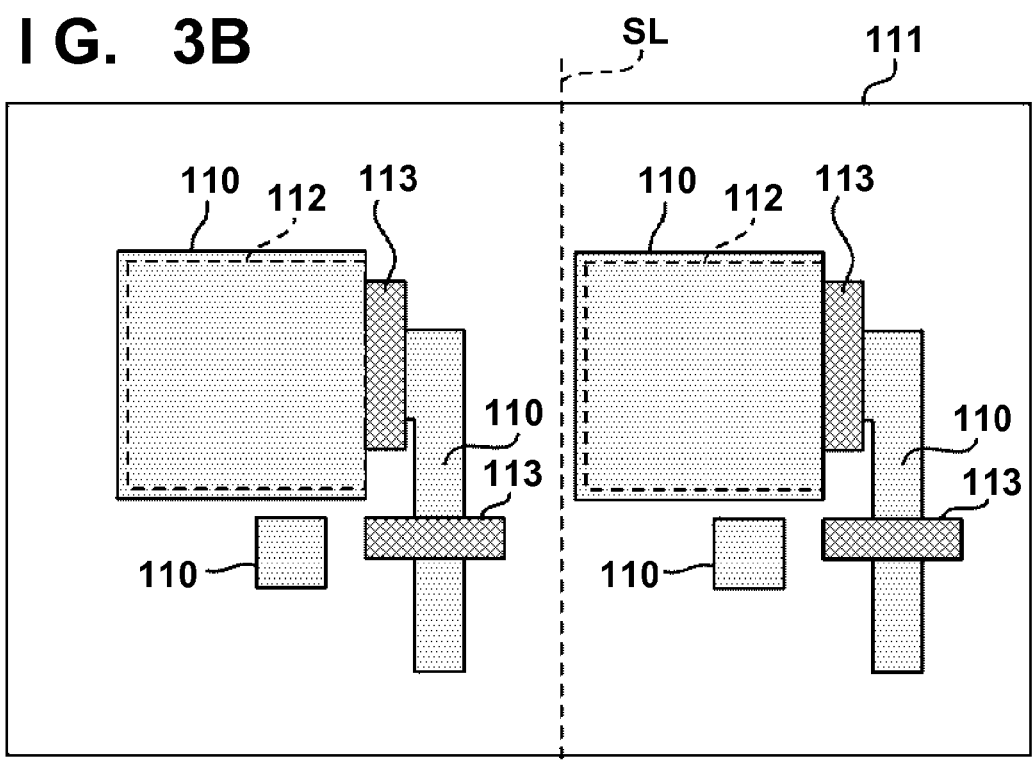
Figure 3C:
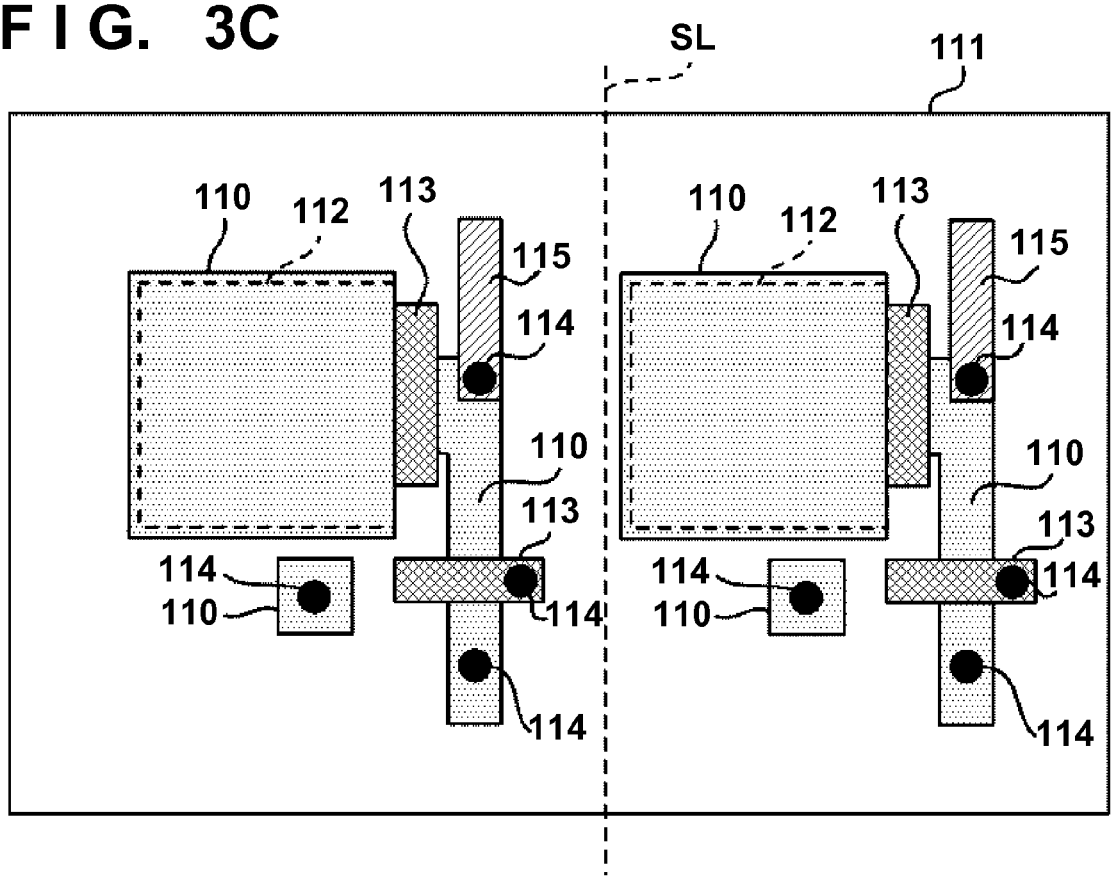

Next, an interlayer insulating film (not shown) is formed on the substrate S formed with the polysilicon patterns 113. Then, a sixth resist pattern is formed, and the interlayer insulating film (not shown) is etched using the sixth resist pattern as an etching mask, thereby forming the contact holes 114 (FIGS. 2A, 2B, and 3C). Note that the sixth resist pattern is preferably formed by the first lithography process including the dividing exposure step, but it may be formed by the second lithography process including the non-dividing exposure step. The contact holes 114 are filled with a conductive member such as metal.

Figure 3D:
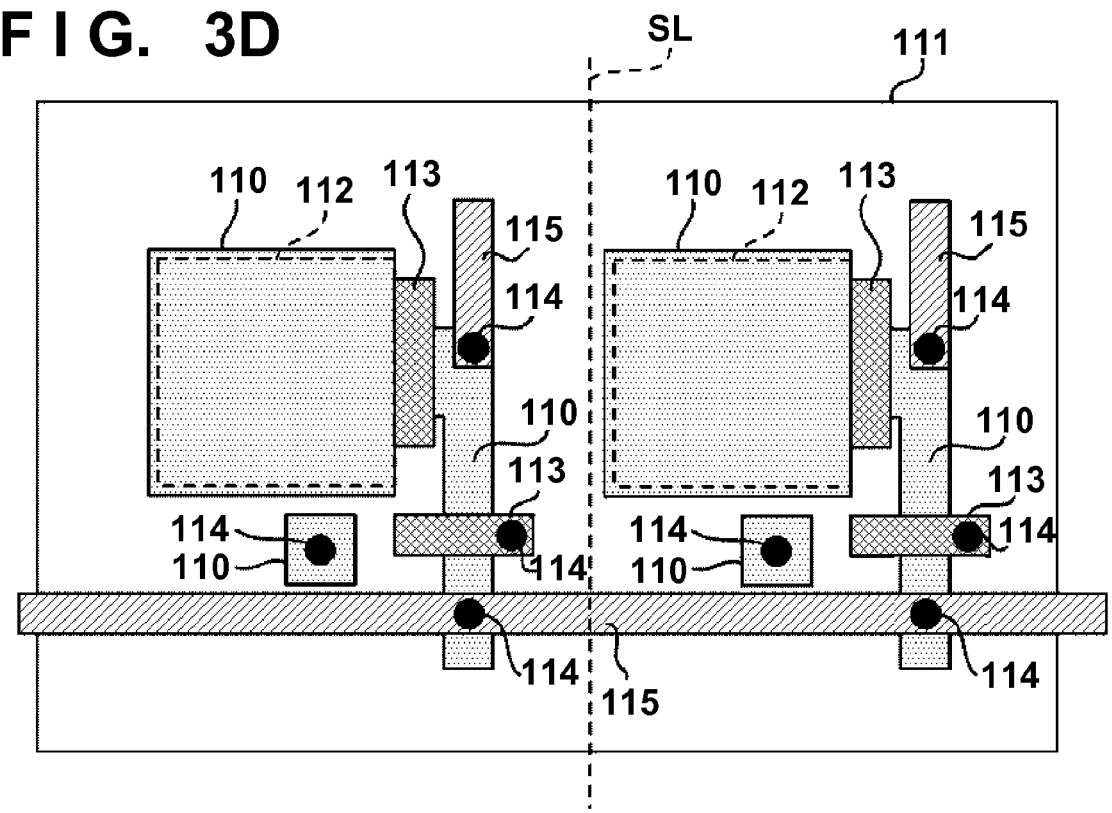

Next, a metal film such as Al—Cu film is formed on the substrate S formed with the interlayer insulating film (not shown). Then, a seventh resist pattern is formed, and the metal film is etched using the seventh resist pattern as an etching mask, thereby forming the metal wiring pattern 115 (FIGS. 2A, 2B, and 3D). Note that the seventh resist pattern is preferably formed by the first lithography process including the dividing exposure step, but it may be formed by the second lithography process including the non-dividing exposure step. After that, a wiring structure on the metal wiring pattern 115, light-shielding pattern 120, color filters, microlenses, and the like can be formed.

Figure 4A:
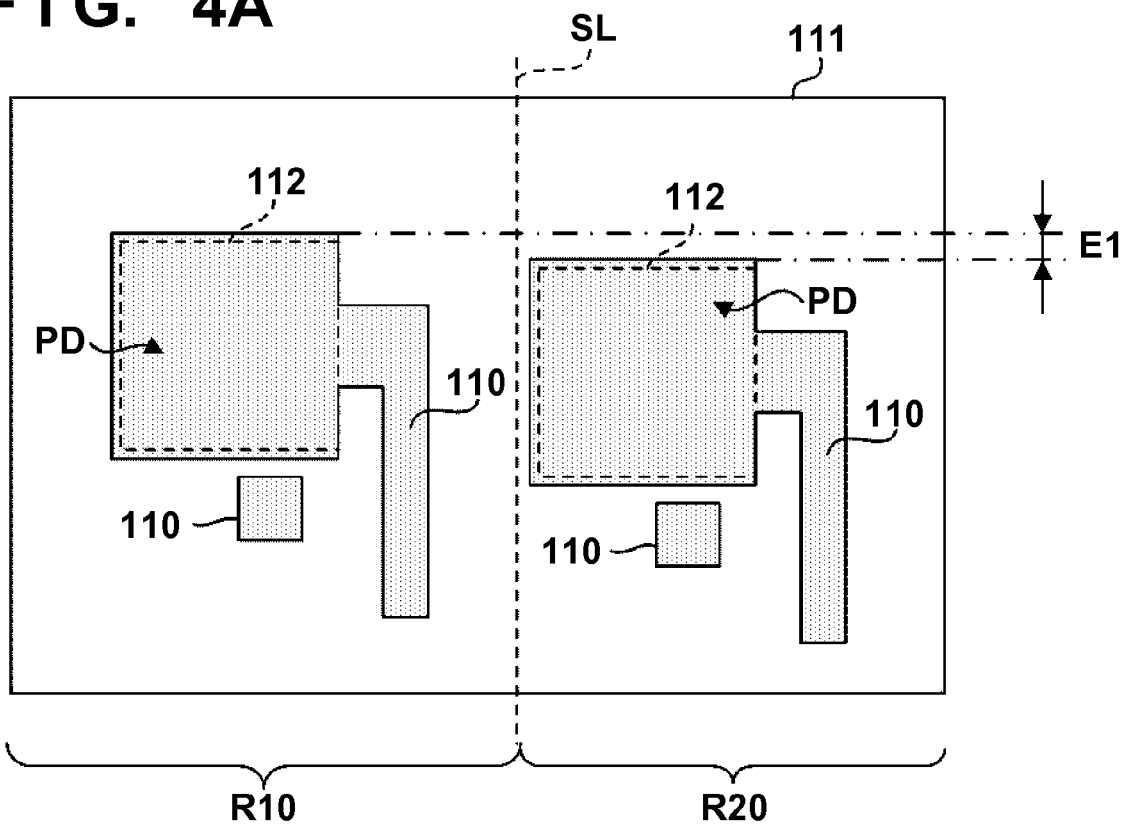
FIGS. 4A and 4B are views for explaining superiority of application of a lithography process including a dividing exposure step upon formation of an active region and charge accumulation region.

Superiority of application of the first lithography process including the dividing exposure step upon formation of the active regions 110 and charge accumulation regions 112 will be described below with reference to FIGS. 4A and 4B. In the example shown in FIG. 4A, the active regions 110 and charge accumulation regions 112 are formed by applying the first lithography process including the dividing exposure step. The active regions 110 of the first and second regions R10 and R20 suffer an alignment error E1, which is emphatically illustrated in FIG. 4A. However, the charge accumulation region 112 of the first region R10 is aligned to the active region 110 of the first region R10, and the charge accumulation region 112 of the second region R20 is aligned to the active region 110 of the second region R20. Therefore, in the first and second regions R10 and R20, alignment precisions between the active regions 110 and charge accumulation regions 112 are high depending on the precision of an exposure apparatus which is used to execute the dividing exposure step.

Figure 4B:
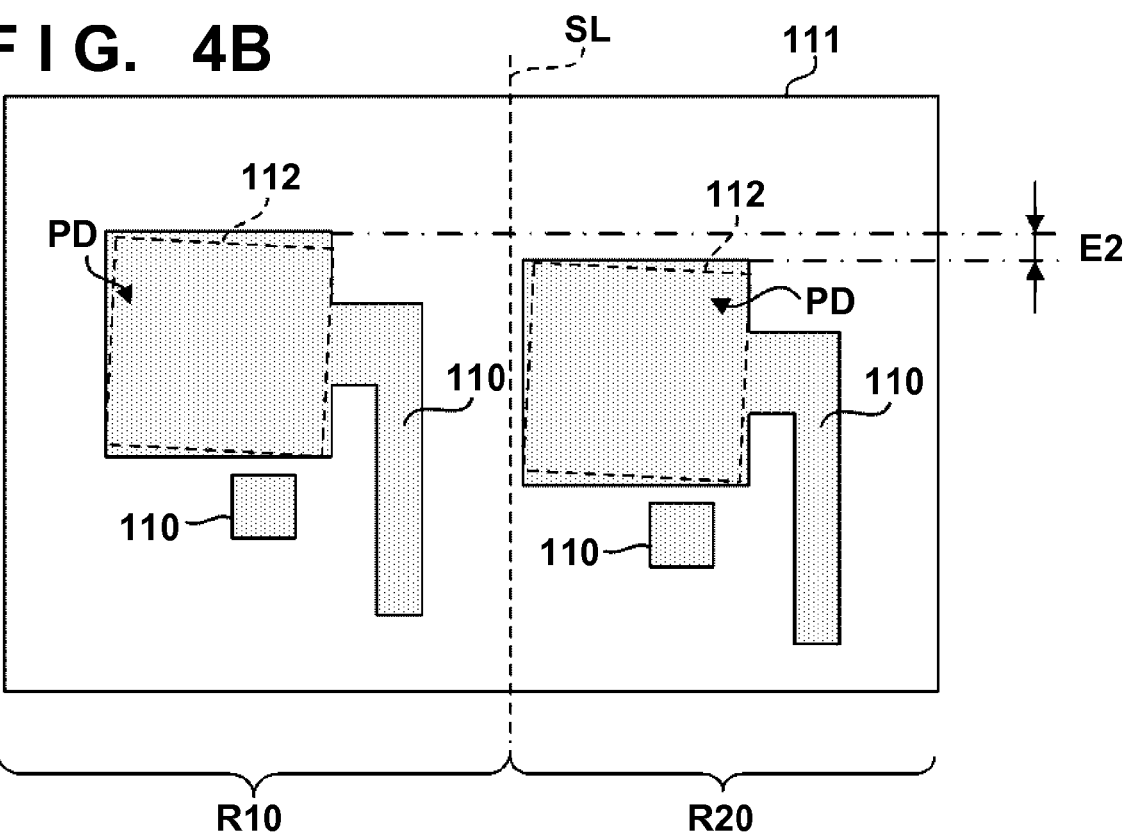

FIG. 4B shows a comparative example. In the comparative example shown in FIG. 4B, the active regions 110 are formed by applying the first lithography process including the dividing exposure step, and the charge accumulation regions 112 are formed by applying the second lithography process including the non-dividing exposure step. The active regions 110 of the first and second regions R10 and R20 suffer an alignment error E2. The second lithography process including the non-dividing exposure step cannot individually attain alignment for the first region R10 and that for the second region R20. Therefore, the alignment precisions between the active regions 110 and charge accumulation regions 112 may become low in both the first and second regions R10 and R20. In this manner, when distances between the active regions 110, that is, the element isolation regions 111 and the charge accumulation regions 112 are different in the first and second regions R10 and R20, mixing amounts of noise caused by crystal defects of the element isolation regions 111 into signals are undesirably different. Then, a difference is generated in an image between the first and second regions R10 and R20, thus forming a stripe at a boundary.

On the other hand, the well region 50 does not require high alignment precision, and can be formed by applying the second lithography process including the non-dividing exposure step, since its boundaries are present near those between the pixel array portion 10 and peripheral circuit portions 20. This contributes to a cost reduction. Also, the light-shielding pattern 120 can be formed by applying the second lithography process including the non-dividing exposure step since it does not require high alignment precision, thus contributing to a cost reduction.

Furthermore, when alignment errors between the charge accumulation regions 112 and regions which form p-n junctions with the regions 112 become large, p-n junction capacitances between the charge accumulation regions 112 and regions which contact the regions 112 become different between the first and second regions R10 and R20, resulting in different image qualities between the regions. However, in this embodiment, the charge accumulation regions 112 and regions which form p-n junctions with the regions 112 are formed by the first lithography process including the dividing exposure step. Therefore, an image with higher image quality can be obtained. Note that the regions which form p-n junctions with the charge accumulation regions 112 include, for example, the semiconductor regions 116, channel stop regions 118, potential barrier regions 119, and the like.

By forming the active regions 110 and charge accumulation regions 112 by the first lithography process including the dividing exposure step like in the present invention, image quality can be improved. Also, since the regions which form p-n junctions with the charge accumulation regions 112 are formed by the first lithography process, sensitivity or noise can be uniformed, thus improving image quality. The improvement of the image quality does not depend on a sequence of the processes and can be provided by (a) forming the active regions 110 and charge accumulation regions 112 in the first lithography process, and/or (b) forming the regions which form p-n junctions with the charge accumulation regions 112 in the first lithography process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-044301, filed Feb. 29, 2012, which is hereby incorporated by reference herein in its entirety.

What is claimed is:

1. A method of manufacturing a solid-state image sensor through a plurality of photolithography processes,
    wherein the plurality of photolithography processes includes at least one first lithography process including a dividing exposure step of exposing a substrate using a plurality of photomasks, and at least one second lithography process including a non-dividing exposure step of exposing the substrate using one photomask,
    the at least one first lithography process includes a process for forming a resist pattern to define active regions on the substrate, and a process for forming a resist pattern to define charge accumulation region.

2. The method according to claim 1, wherein the at least one first lithography process includes a process for forming a resist pattern to define semiconductor regions arranged on the charge accumulation regions, and
    a conductivity type of the semiconductor regions is different from a conductivity type of the charge accumulation regions.

3. The method according to claim 1, wherein the at least one first lithography process includes a process for forming a resist pattern to define potential barrier regions arranged between neighboring charge accumulation regions, and a conductivity type of the potential barrier regions is different from a conductivity type of the charge accumulation regions.

4. The method according to claim 1, wherein the at least one first lithography process includes a process for forming a resist pattern to define channel stop regions arranged around element isolation regions.

5. The method according to claim 1, wherein the solid-state image sensor includes a pixel array portion and peripheral circuit portions, elements included in the pixel array portions are formed in a common well region, and the peripheral circuit portions are formed outside the well region, and
    the at least one second lithography process includes a process for forming a resist pattern to define the well region on the substrate.

6. The method according to claim 1, wherein the at least one second lithography process includes a process for forming a resist pattern to define a light-shielding pattern.

* * * * *